(12) United States Patent
De Ambroggi et al.

(10) Patent No.: US 7,355,908 B2
(45) Date of Patent: Apr. 8, 2008

(54) NONVOLATILE STORAGE DEVICE AND SELF-REDUNDANCY METHOD FOR THE SAME

(75) Inventors: Luca De Ambroggi, Catania (IT); Carmelo Condemii, Gravina Di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 510 days.

(21) Appl. No.: 10/639,240

(22) Filed: Aug. 11, 2003

(65) Prior Publication Data

US 2004/0130953 A1 Jul. 8, 2004

(30) Foreign Application Priority Data

Aug. 13, 2002 (EP) .................................. 02425529

(51) Int. Cl.
*G11C 7/00* (2006.01)
(52) U.S. Cl. ................. 365/200; 365/210; 365/189.01; 365/230.06
(58) Field of Classification Search ................. 365/200, 365/241, 230.05, 189.07, 210, 230.06
See application file for complete search history.

(56) References Cited

U.S. PATENT DOCUMENTS

| | | | | |
|---|---|---|---|---|
| 5,153,880 A | * | 10/1992 | Owen et al. ................. 365/200 |
| 5,572,707 A | * | 11/1996 | Rozman et al. .............. 711/170 |
| 5,668,818 A | | 9/1997 | Bennett et al. .......... 371/22.31 |
| 5,889,710 A | * | 3/1999 | Pascucci ..................... 365/200 |
| 5,940,323 A | | 8/1999 | Kwon .................... 365/185.22 |
| 6,178,126 B1 | * | 1/2001 | Kirihata et al. ............. 365/200 |
| 6,188,618 B1 | * | 2/2001 | Takase ........................ 365/200 |
| 6,243,306 B1 | * | 6/2001 | Kirihata ..................... 365/200 |
| 6,363,020 B1 | | 3/2002 | Shubat et al. ................ 365/200 |
| 6,388,929 B1 | * | 5/2002 | Shimano et al. ............ 365/201 |
| 6,556,490 B2 | * | 4/2003 | Shubat et al. ............... 365/200 |
| 6,697,289 B1 | * | 2/2004 | Yamamoto .................. 365/200 |
| 6,735,727 B1 | * | 5/2004 | Lee ............................. 365/200 |
| 2002/0031025 A1 | * | 3/2002 | Shimano et al. ............ 365/201 |
| 2002/0031026 A1 | | 3/2002 | Kobayashi .................. 365/201 |
| 2002/0163840 A1 | * | 11/2002 | Hiraki et al. ........... 365/189.05 |

FOREIGN PATENT DOCUMENTS

| | | |
|---|---|---|
| EP | 0 805 451 A2 | 11/1997 |
| EP | 0 867 810 A2 | 9/1998 |
| EP | 1 107 121 A2 | 6/2001 |

* cited by examiner

*Primary Examiner*—Thong Q. Le
(74) *Attorney, Agent, or Firm*—Lisa K. Jorgenson; Timothy L. Boller; Seed IP Law Group PLLC

(57) ABSTRACT

The nonvolatile storage device is made up of a memory array divided into a plurality of data-storage units and a plurality of redundancy-storage units for replacing respective failed data-storage units. A control unit detects the functionality of the data-storage units and, in case of failure, enables a redundancy-detection unit having a plurality of volatile-memory elements connected through a sequential daisy-chain connection. A nonvolatile memory unit stores, in a nonvolatile way, the redundancy information through a data bus, connected both to the redundancy-detection unit and to the nonvolatile memory unit; in the event of failure, the redundancy-detection unit transfers the addresses of the failed data-storage unit to the nonvolatile memory unit for their nonvolatile storage.

17 Claims, 5 Drawing Sheets

NONVOLATILE STORAGE DEVICE AND SELF-REDUNDANCY METHOD FOR THE SAME

BACKGROUND OF THE INVENTION

1. Field of the Invention

The present invention relates to a nonvolatile storage device and a self-redundancy method of using the same.

2. Description of the Related Art

As is known, redundancy structures are provided for replacing failed memory locations so as to prevent the rejection of the entire storage device if one location of the memory array fails.

Normally, the replacement of the failed memory location with the redundancy part takes place in final production steps, when a special test, referred to as electrical wafer sorting (EWS), detects a failure.

The structure commonly used for storing the addresses of redunded or replaced memory locations is principally made up of CAM banks, i.e., nonvolatile storage units, programmable and erasable by the manufacturer in the testing step. In particular, when a failure is detected in a memory location, information designed to determine uniquely the memory location to be replaced is stored in the CAMs.

The information stored in the CAMs may be of various kinds: the addresses of the location to be repaired, whether and which bit packet of the word addressed is to be replaced, whether an entire sector is to be replaced, whether the bank has already been used for storing an address of a failed location or not (guard information), etc.

The number of banks present in the redundancy structure defines the maximum number of packets (columns, bytes, rows, sectors—hereinafter indicated also as memory units or memory locations) that can be replaced in the entire memory array. When, then, the location has been replaced, it is necessary to carry out a number of operations for identifying the redundancy location that stores the information instead of the failed location.

The check and the possible redundancy replacement are carried out for any operation, either reading or writing, that is to be performed on the failed location, when addressing of the location in the memory array is required.

The structure for managing redundancy has the function of verifying whether the memory array location addressed is among the replaced ones and, if so, provides for activation of the redundancy locations and for the simultaneous de-activation of the decoding of the memory array corresponding to the defective location.

In particular, the address of the location that is to be read or written (program or erase) is compared with the addresses of the replaced locations during the testing steps and, in the event of coincidence with one of them, a "hit" signal is generated that has the task of activating the redundancy circuitry and of replacing the failed location (whether it be a bit, a byte, a word, or a sector) by physically pointing to the redundancy unit.

In the ensuing description, the discussion will be an example of sector redundancy. The following considerations are, however, readily applicable to other types of redundancy, such as, for example, column redundancy, row redundancy, etc.

In the literature, sector redundancy is complementary to column redundancy and is preferred to row redundancy for high memory density devices (i.e., with a density greater than or equal to 16 Mbits). Furthermore, sector redundancy is preferred as regards area, speed and performance of the memory during reading operations, and finally because of a greater flexibility in solving serious problems that may arise in the array, such as for example shorts between wordlines and substrate.

At present, the common sector redundancy envisages a plurality of redundancy units, which, for area efficiency and yield, may be expressed as a redundancy unit (a redundancy sector) for each multiple of 16 Mbits. Each redundancy unit is therefore associated to a CAM comprising a plurality of nonvolatile cells, equal to the number of bits of the address necessary for identifying each sector of the memory array. Each CAM thus identifies a failed sector.

Furthermore, a further nonvolatile memory element, referred to as guard CAM, is associated to each redundancy unit and stores a guard information specifying whether the associated redundancy unit has been used or not.

During reading or programming of cells of the memory array, the comparison between the addresses supplied from outside by the user and the ones stored in the CAMs generates, in the presence of the guard information activated, the "hit" signal mentioned above.

In present memory architectures, the content of the CAMs, programmed, as has been said, during the EWS testing step, is read continuously throughout the lifetime of the device, using a structure the cells whereof are directly connected, through the drain terminal, to latches that buffer the content of the information present in the CAMs.

Programming is performed by using the same switch structure (the so-called "program loads") present in the array, disabling the array-decoding circuits, enabling the redundancy ones, and causing the datum (drain voltage) to move along bitlines (main bitline in the case of a hierarchical architecture) present in the memory array.

This architecture does not enable ease of activation and management of redundancy for addressing the nonvolatile cells during normal operation of the device by using an automatic replacement algorithm that exploits structures and circuits already present in the device.

BRIEF SUMMARY OF THE INVENTION

The aim of the invention is consequently to provide a storage device and a method that enable activation and management of redundancy during normal operation using the circuits already present in the array for reading, programming, erasing and verifying.

According to the present invention, a nonvolatile storage device and a redundancy method are provided, as defined in claims 1 and 10, respectively. In addition, a method of establishing a changeable relationship between a register and a redundancy sector is defined in claim 12, and a method for loading data into registers at power-on of memory in claim 14.

BRIEF DESCRIPTION OF THE SEVERAL VIEWS OF THE DRAWINGS

For a better understanding of the present invention, a preferred embodiment is now described, purely by way of non-limiting example, with reference to the attached drawings, wherein.

DETAILED DESCRIPTION OF THE INVENTION

Figure 1:
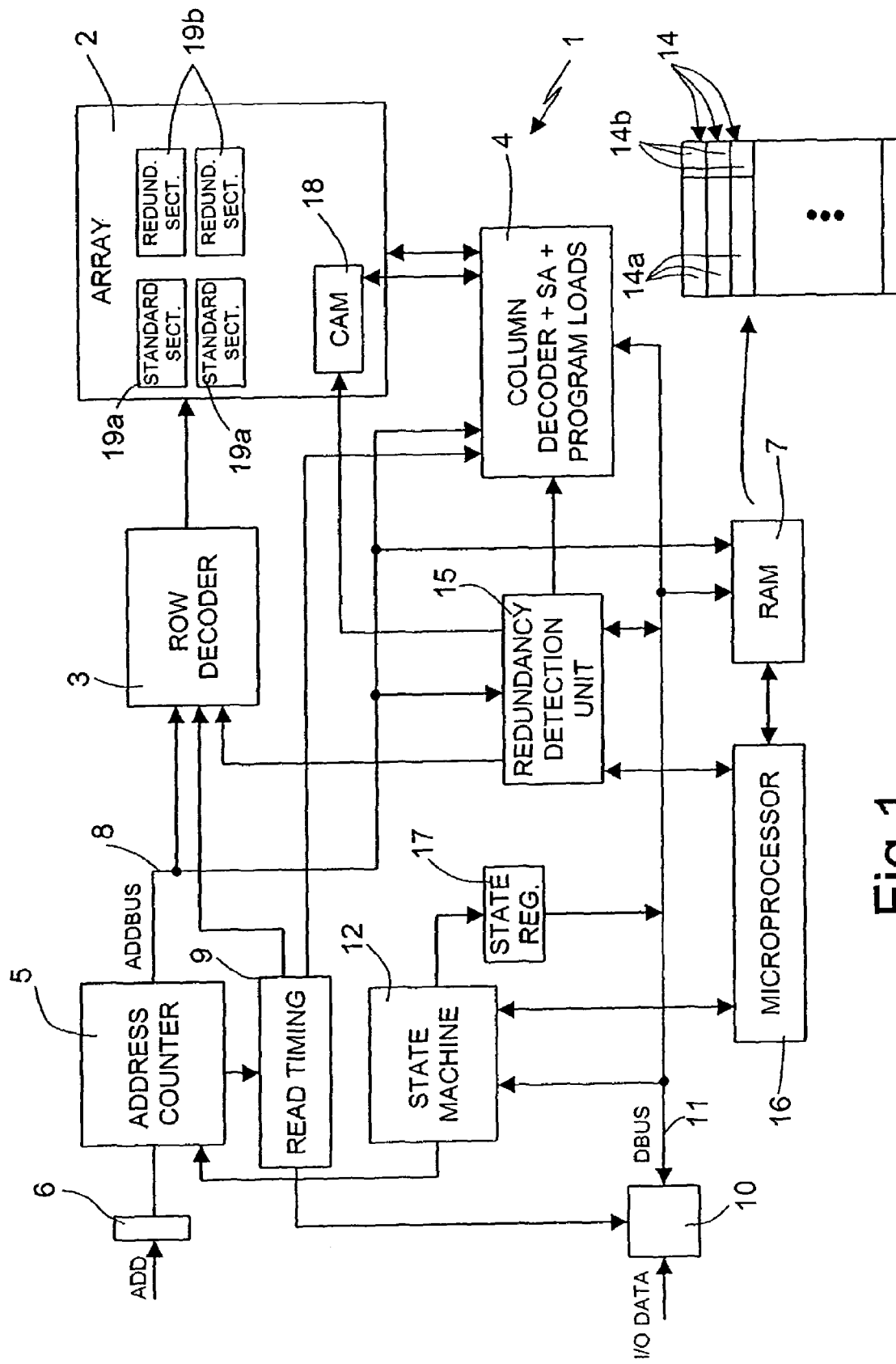
FIG. 1 illustrates a block diagram of a storage device according to the invention.

In the device and method described in detail hereinafter, the reading structure already present for reading the array, the structure storing the sectors for managing failures and sectors to be erased, and the counter of the present addresses are used. In this way, even the entire testing structure and the testing procedure of the DMA test, shadow test, and CAM program-and-erase test, may be kept unaltered.

For a better understanding of the invention, the simplified structure of a memory 1, of a flash type in one example, having the circuit according to the invention for the implementation of self-redundancy, is now described with reference to FIG. 1. The memory 1 may be an EEPROM, SRAM, DRAM or other memory.

The memory 1 comprises a memory array 2 made up of standard sectors 19a (only two of which are shown) and of redundancy sectors 19b (only two of which are shown). The memory array 2 is connected, in a known way, to a row-decoder block 3 and to a column-decoder block 4. The column-decoder block 4 further comprises sense amplifiers SA and program loads, both built according to a known structure.

An address-counter block 5 has an input connected to an address-input gate 6, from which it receives, from outside, general addresses ADD; the address-counter block 5 generates, under the control of a state machine 12, internal addresses for addressing the memory array 2, supplied on an address bus 8 (ADDBUS). The address bus 8 is connected to the row-decoder and column-decoder blocks 3, 4 and to a redundancy-detection unit 15 (the structure whereof will now be described in greater detail with reference to FIG. 2). The address-counter block 5 is moreover connected, through the address bus 8, to a RAM 7, which constitutes a sector memory.

In detail, as is represented schematically in the enlarged detail, the RAM 7 is divided into a plurality of portions or rows 14, one for each sector of the memory array 2, each portion 14 comprising a first subportion 14a and a second subportion 14b. During erasing, the first subportion 14a stores the address of a memory location where checking must start after application of the erasing pulses (and thus operates as a pointer), while the second subportion 14b stores a flag, the logic state of which indicates whether the associated sector is to be erased or not.

The address counter 5 is moreover connected to a sense-timing circuit 9, which supplies appropriate enabling signals to the row-decoder and column-decoder blocks 3, 4 as well as to a data-input/output unit 10. The data-input/output unit 10 is moreover connected to a data bus DBUS 11, which is in turn connected to the column-decoder block 4, to the state machine 12, to the redundancy-detection unit 15, to the RAM 7, and to a state register 17.

The state machine 12 exchanges information with a microprocessor control unit 16 and sends state information to the state register 17. The control unit 16 moreover exchanges information and commands with the redundancy-detection unit 15 and the RAM 7. The control unit 16 need not be a microprocessor and a microprocessor is not required in all embodiments. Indeed, a very simple circuit may be used for control unit 16. For example, it may be part of the state machine 12 or the read timing circuit 9.

The redundancy-detection unit 15 is moreover connected to the row-decoder and column-decoder blocks 3, 4, and to the CAMs 18 (just one of which is shown), designed for storing the addresses of the replaced sectors. The CAMs 18 are functionally associated to the memory array 2, and share with this the same address and read circuits. Hence, for simplicity, in FIG. 1 the CAMs 18 are represented as belonging to the memory array, even though they may be physically separate, albeit contiguous thereto.

As explained in greater in detail hereinafter, at turning-on of the memory, the redundancy-detection unit 15 receives from the memory array 2, and precisely from the CAMs 18, read via the column-decoder block 4, the previously stored redundancy data and writes them, in a volatile way, in registers where they are immediately accessible. Namely, they are written into volatile registers or some acceptable volatile memory cell. Subsequently, when the address counter 5 supplies the row and column addresses of words to be read, the redundancy-detection unit 15 compares the addresses received on the data bus 11 with the ones stored in its own registers, and, if it detects an identity, replaces the addresses received with the redundancy ones so as to address the redundancy sectors 19b, as explained in detail hereinafter with reference to FIG. 2.

Furthermore, during erasing and programming, when a failure is detected in one or more standard sectors 19a, the redundancy-detection unit 15 receives the addresses of the failed sectors, supplied by the address counter 5 on the address bus 8, and, under appropriate control of the control unit 16, writes them in a temporary way in its own registers and subsequently, via the data bus 11, in the CAMs 18.

Figure 3:
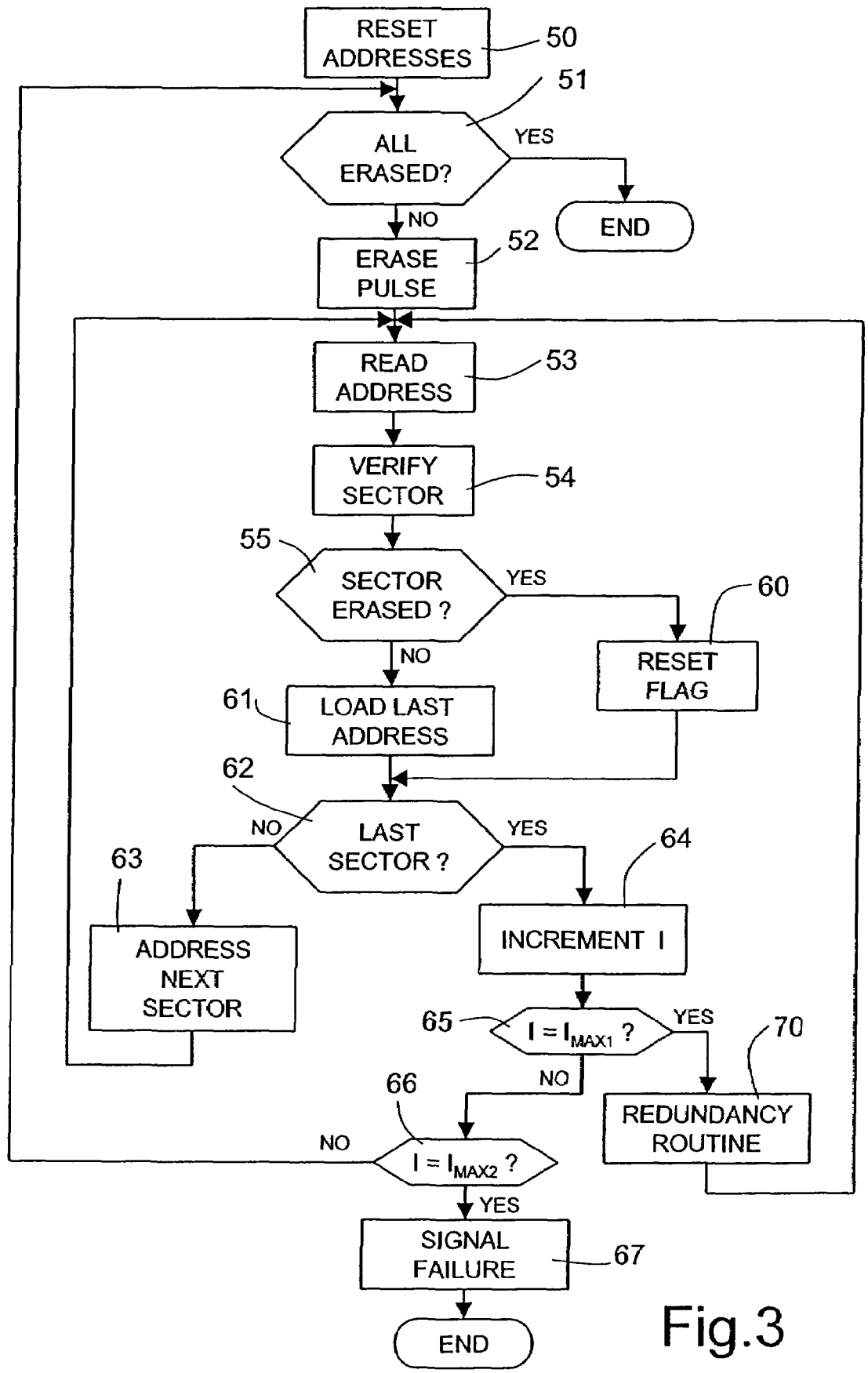
FIGS. 3 and 4 are flowcharts of the method according to the invention.

Hereinafter the structure of the redundancy-detection unit 15 is described as regards redundancy during the operation of the device (erasing, as described below with reference to FIGS. 3 and 4, or else programming and reading).

Figure 2:
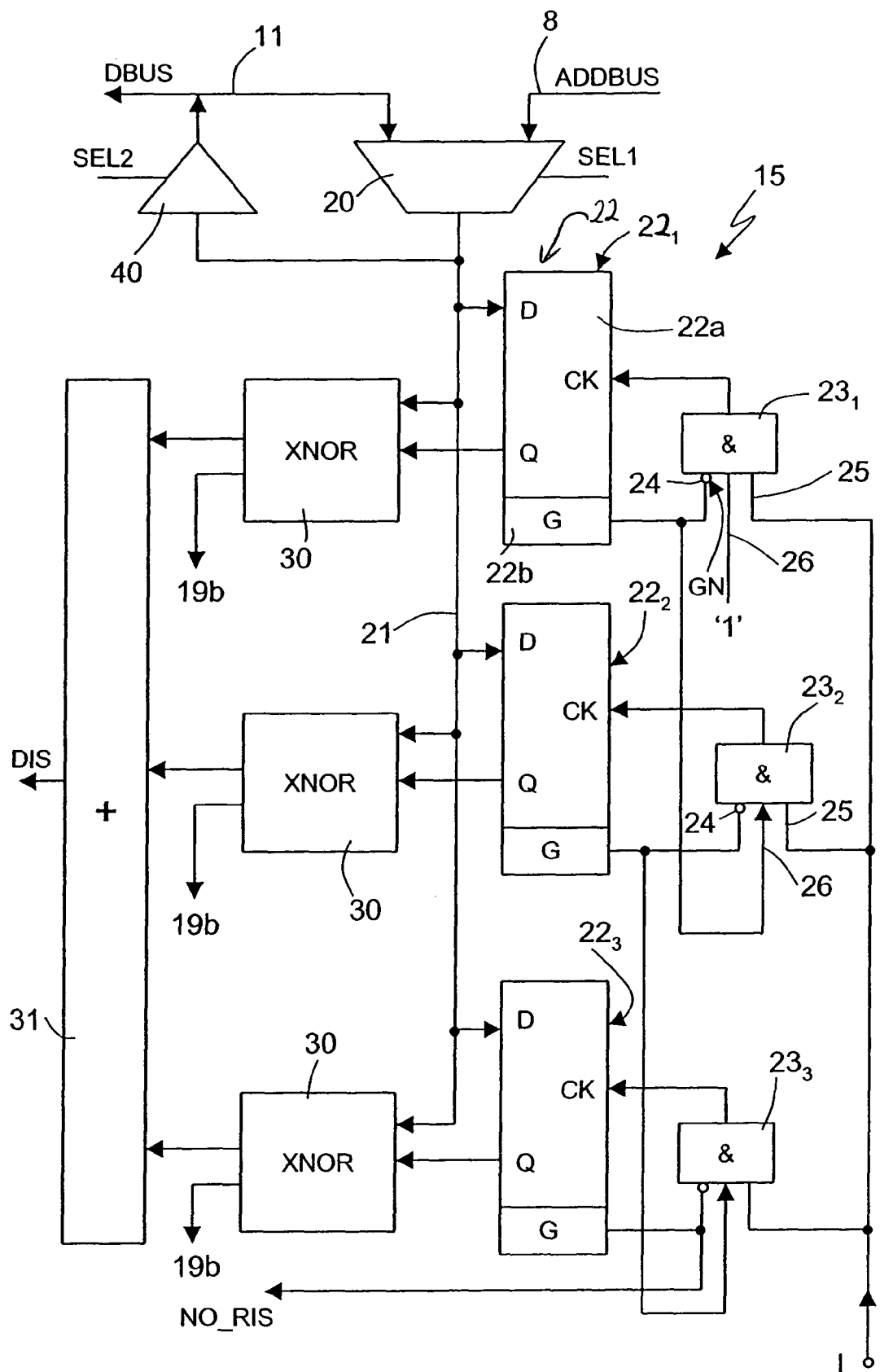
FIG. 2 is a simplified circuit diagram of block 15 of FIG. 1, according to the invention.

With reference to FIG. 2, the redundancy-detection unit 15 comprises a switching gate 20 having a first data input connected to the data bus 11, a second data input connected to the address bus 8, a selection input receiving a first control signal SEL1 from the control unit 16, and an output connected to a redundancy bus 21. The output of the switching gate 20 is moreover connected to the storage bus 11 via a buffer 40 controlled by a second control signal SEL2, supplied by the control unit 16.

The redundancy bus 21 is connected to the data input D of a plurality of registers 22 (in the example three are shown), designated by $22_1$, $22_2$, $22_3$, daisy-chain connected and made up of latches. In general, the number of registers 22 is equal to the number of available redundancy resources (number of redundancy sectors 19a) and of self-redundancy CAMs 18.

In detail, each register 22 is divided into two parts: a first part 22a, for storing an entire address of a failed sector, and a second part 22b, for storing a guard bit, the logic value whereof is indicative of whether the corresponding register 22 has already been loaded or not with an address of a failed sector. Each register 22 further comprises a synchronization input CK, a guard output G (connected to the second part 22b), and an output address Q, connected to the second portion 22b.

The registers $22_1$, $22_2$, $22_3$ have the synchronization input CK connected to the output of a respective AND gate $23_1$, $23_2$, $23_3$. The AND gates $23_1$, $23_2$, $23_3$ are of the three-input type: a first input 24, of an inverted type, is connected to the guard output G of a respective register $22_1$, $22_2$, $22_3$ and receives an inverted guard bit GN equal to the corresponding inverted guard bit; a second input 25 receives a load signal L supplied by the control unit 16; and a third input 26 is connected to the guard output of a preceding register, except for a first register 22₁. In detail, the first register 22₁ has the third input 26 connected in a fixed way to a voltage corresponding to a logic level "1"; a second register 22₂ has the third input 26 connected directly to the guard output G of the first register 22₁; and the third register 22₃ has the third input 26 connected directly to the guard output G of the second register 22₂. Other possible registers are likewise connected starting from the third register 22₃.

The last register (here the third register 22₃) has the guard output G connected to the control unit 16, which supplies a signal NO_RIS, the logic value of which indicates whether further free redundancy resources are present or not.

The address outputs Q of the registers 22₁, 22₂, 22₃ are connected each to a first input of a respective XNOR gate 30.

The XNOR gates 30 moreover have a second input connected to the redundancy bus 21, and a first output connected to a logic adder circuit 31, which outputs a disable signal DIS supplied to the row-decoder and column-decoder blocks 3, 4 of FIG. 1. Each of the XNOR gates 30 further have a second output connected rigidly to a respective redundancy sector 19b, for enabling thereof, as explained below.

The redundancy-detection unit 15 operates as described hereinafter. As soon as redundancy is activated following upon the detection of one or more failed sectors after a modification operation (as described in detail hereinafter with reference to FIGS. 3 and 4 for erasing), the switching gate 20 is controlled by the first selection signal SEL1 so as to connect the address bus 8 to the redundancy bus 21. In this step, the buffer 40 is still inactive, and the address bus 8 supplies, in addition to the address of a failed sector, the guard bit, having logic value "1". This bit is programmed after the address information has been programmed in the CAMs. In this way, in the event of an accidental power-down between programming the addresses and programming the guard bit, it notifies the fact that the programmed information is incomplete.

Assuming that the redundancy has not yet been activated previously, the first register 22₁ is still empty and its guard bit G is still in the inactive state, corresponding to a logic "0"; consequently the inverted guard bit GN is equal to "1". Hence, as soon as the load signal L switches to the high state, the first AND gate 23₁ supplies, to the synchronization input CK, a "1", which enables loading of the address and of the guard bit supplied on the redundancy bus 21 inside the first register 22₁.

Instead, when the load signal L switches, the second and the third AND gates 23₂, 23₃ receive the previous value of the guard bit G of the first and second registers 23₁, 23₂ (still at "0") and consequently are not enabled for loading.

In this step, the XNOR gates 30 and the logic adder circuit 31 are practically disabled or in any case supply non-significant signals, which are ignored by the row-decoder and column-decoder blocks 3, 4.

At the subsequent redundancy activations, the data are loaded each time into a subsequent register 22₂, 22₃. In fact, at the second activation, the first register 22₁ disables its own AND gate 23₁ and enables the subsequent AND gate 23₂, since it has the guard bit G in the high state. Next, upon arrival of the load signal L, the address and the guard bit are stored in the second register 22₂. The third register 22₃ and possible subsequent registers remain, however, disabled.

In this way, it is possible to store the address of a number of failed sectors equal to the number of registers 22 present.

After all the registers 22 have been loaded, the high value of the guard bit G of the last register (here the third register 22₃), which constitutes the signal NO_RIS, signals that there are no longer available further redundancy resources.

Immediately after loading the address of a failed sector in one of the registers 22, this is stored in a nonvolatile way in a CAM 18. To this end, the address of the failed sector, still present on the address bus 8, is supplied to the storage bus 11 via the switching gate 20 and the buffer 40, now activated by the second selection signal SEL2. Consequently, the address of the failed sector is supplied to the column-decoder block 4, as explained in detail hereinafter.

Upon turning-on of the memory 1, when the POR (Power-On Reset) signal is generated, the contents of the CAMs 18 that store the addresses of the failed sectors previously detected are supplied in a sequential way on the storage bus 11 and are loaded sequentially into the registers 22 via the switching gate 20, which now connects the storage bus 11 to the address bus 8 on a command from the control unit 16. Loading takes place sequentially in the different registers 22, in a manner similar to what is described above. In this way, at each turning-on of the memory, the registers 22 are loaded with the redundancy data previously stored.

During reading, the address supplied on the address bus 8 is fed, by the redundancy bus 21, to the XNOR gates 30, which compare it to the failed-sector address supplied by the respective register 22. If the address supplied on the address bus 8 does not correspond to any of the addresses stored by the registers 22, the XNOR gates generate a non-recognition signal (disable signal DIS in the inactive state), and the row-decoder and column-decoder blocks 3, 4 operate in the usual way on the basis of the address present on the address bus 8. Instead, if one of the XNOR gates recognizes the equality with the address stored in the associated register 22, it generates a recognition signal, which is supplied to the logic adder circuit 31. Consequently, in this step, the disable signal DIS goes into the active state and disables the address present on the address bus 8 (disabling of the standard sector 19a addressed by the address counter 5 of FIG. 1). Furthermore, the XNOR gate 30, which has recognized the equality, enables the redundancy sector 19b associated thereto.

Hereinafter, with reference to FIGS. 3 and 4, the procedure for erasing groups of sectors is described, where activation of redundancy on-line is carried out when detecting failed memory locations.

This procedure uses the RAM 7 of FIG. 1, wherein the flags corresponding to the sectors to be erased are set in the second subportions 14b (flags in the active state), in a known way, before activating erasing. The RAM 7 thus represents a list of sectors to be erased, identified by the respective flags in active state.

In the ensuing description, it is moreover assumed that one or more sectors belonging to a preset group are to be erased; the same procedure is, however, applicable to the entire memory array.

Initially, step 50, the first subportions 14a of the portions 14 having flags in the set or active state (and consequently corresponding to the sectors to be erased) are reset, so as to contain the address of the first word of each respective sector. In addition, a sector counter is initialized with the first sector of the considered sector group.

Next, step 51, a check is made to see whether all the blocks to be erased have actually been erased by checking the state of the flags. If they have (all the flags in the inactive state), erasing terminates; otherwise, an erasing pulse is sent to all the sectors identified by the flags in the active state, step 52.

Next, step 53, the address stored in the first subportion 14*a* corresponding to the first sector of the list that has an active flag is read. As said, this address corresponds initially to the first word of the sector; hereinafter, as described below, it represents the address of the last word of the sector that has been checked (and for which the check has not been successful).

Subsequently, step 54, the considered sector is checked, starting from the word identified by the address just read and proceeding until the entire sector has been checked or detecting a word not correctly erased. If the entire sector has been erased (output YES from step 55), the flag corresponding to the sector just erased is reset (i.e., it is brought to the inactive state) by erasing in practice the sector itself from the list of the sectors to be erased, step 60. Then, the procedure goes to step 62, as described below.

If the check is interrupted on account of the detection of a word not correctly erased, output NO from step 55, the first subportion 14*a* is written with the address of the word just checked and for which the check has given a negative result, step 61. Then, a check is made to see whether the sector just checked is the last in the list, step 62.

If there are still sectors to be checked, output NO from step 61, a next sector is addressed, incrementing the sector counter, step 63, and then the procedure returns to step 53, where the address stored in the first subportion 14*a* of the RAM 7 and corresponding to the next sector just addressed is read. Instead, if all the sectors have been checked (but, of course, some contain words not correctly erased), output YES from step 62, a number-of-attempts counter I is incremented, step 64.

This counter (which indicates the number of supplied programming pulses) has the purpose of enabling the repetition of the cycle that comprises applying an erasing pulse and verifying the cells of the sectors starting from the ones that have yielded a negative result in the previous check. Only if, after a certain number of cycles, at least one cell is still not correctly erased, a redundancy routine is activated, and subsequently further cycles of erasing and verifying are repeated. If after these further cycles the sectors are still not erased, an error signal is generated ("fail").

For this purpose, after step 64, a check is made to see whether the number-of-attempts counter I is equal to a first threshold value $I_{MAX1}$. If it is, a redundancy routine 70 is activated, described hereinafter with reference to FIG. 4, and the program goes back to step 53 for reading the address of the first sector that has an active flag; otherwise, output NO from step 65, a check is made to see whether the number-of-attempts counter I is equal to a second threshold value $I_{MAX2}$ greater than $I_{MAX1}$, step 66. If not, the program goes back to step 51 for checking whether all the sectors have been erased, to repeat the cycle of applying erasing and verifying pulses, or to terminate the procedure, if all the sectors have been erased. If they have (the number-of-attempts counter I is equal to the second threshold value $I_{MAX2}$), a failure signal is generated, step 67, and the procedure terminates.

Figure 4:
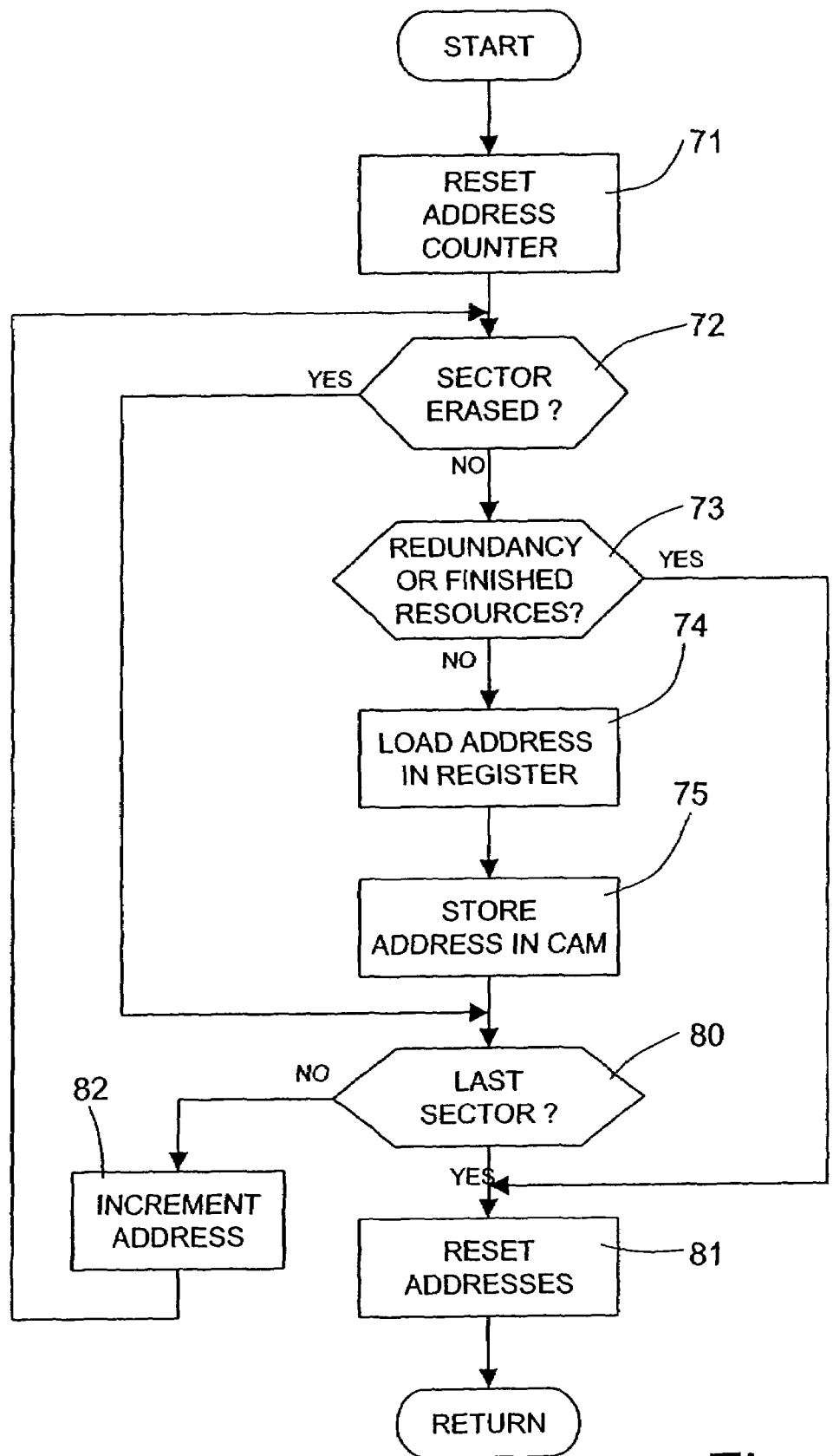

With reference to FIG. 4, the redundancy routine 70 starts with resetting the sector counter, step 71, and checking whether the first sector addressed by the sector counter has already been erased, by reading the state of the corresponding flag, step 72. If it has, a check is made to see whether all the sectors have been checked, step 80; otherwise, a check is made to see whether the sector currently addressed is already a redundancy sector or whether there are no longer available further redundancy resources, step 73. If this is the case, it is no longer possible to activate further redundancy resources; consequently, step 81, all the pointers are reset (addresses stored in the first subportions 14*a* of the RAM 7), and the redundancy routine 70 terminates.

Instead, if redundancy resources are still available, output NO from step 73, loading of the address of the current sector in the first register 22 available is commanded (according to the description made with reference to FIG. 2), step 74, and the same current address is stored in a nonvolatile way in a CAM 18 (as previously described), step 75. Then, the program goes to step 80 for verifying whether the presently addressed sector is the last of the list stored in the RAM 7. If not, step 82, the sector counter is incremented, and the procedure returns to step 72; if it is, the program continues with step 81, as mentioned above. From now on, the portion 14 of the RAM 7 previously associated to a failed sector stores the information related to the redundancy sector that replaces it, and specifically the address of the first word to be checked and the erasing flag. In this way, returning to the main procedure of FIG. 3, the redundancy sector or sectors just enabled is/are erased and checked in the way described above.

After resetting the addresses loaded in the RAM 7, the redundancy routine 70 terminates.

Figure 5:
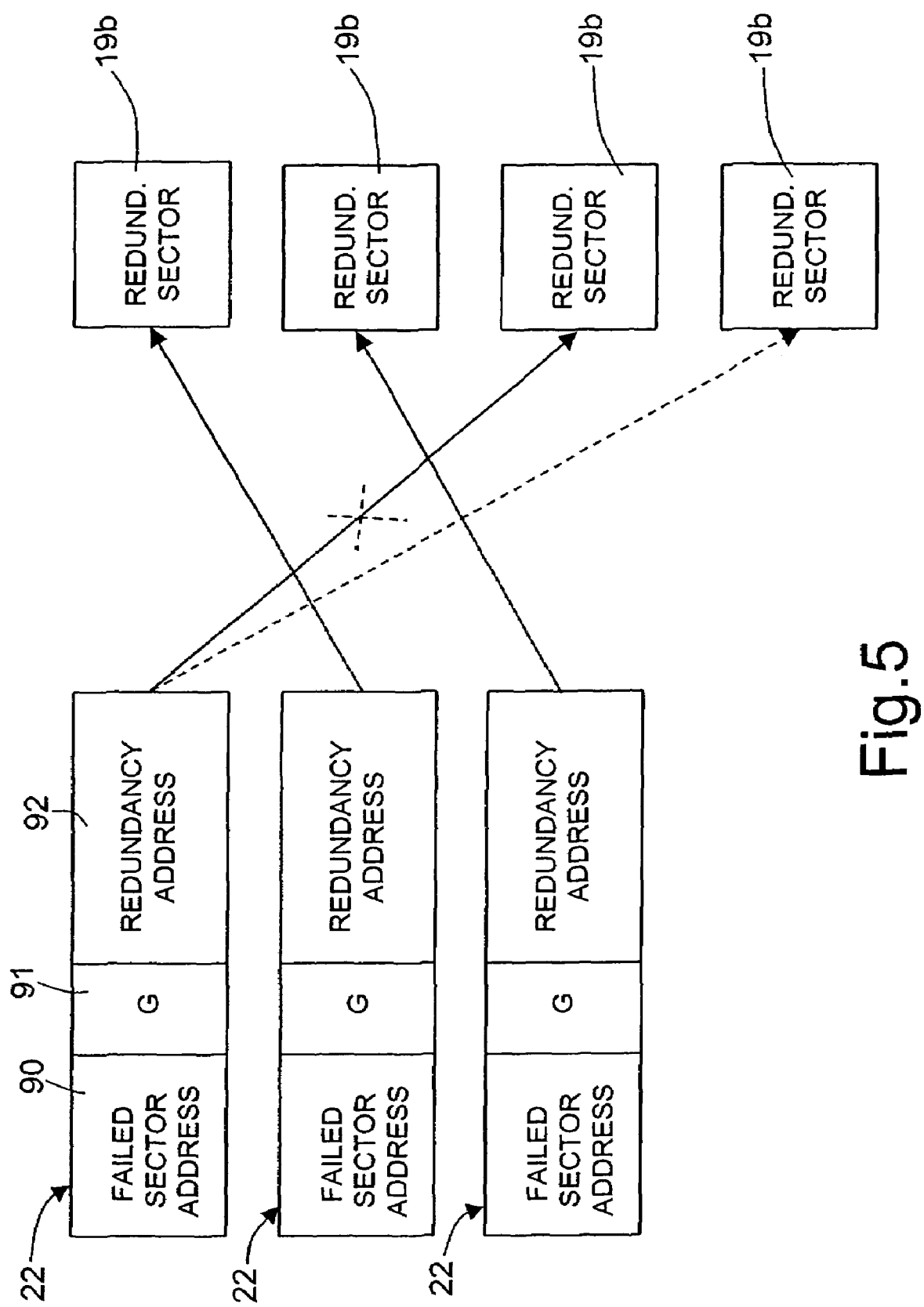
FIG. 5 illustrates a diagram of the association between registers and redundancy sectors, according to the invention.

FIG. 5 illustrates a structure of the registers 22 that enables the redundancy of a redundancy sector in the event of a failure occurring such as to render it unusable. For this purpose, instead of having a rigid association between each register 22 and the corresponding redundancy sector, the association is fixed when a failed sector is detected, and the address of the redundancy sector is stored together with the address of the replaced sector.

In the example of FIG. 5, each register 22 (and consequently each CAM 18 storing the same data in a nonvolatile way) comprises a first portion 90 storing the address of a failed sector, a second portion 91 storing the guard bit G, and a third portion 92 storing the address of the redundancy sector (which replaces the sector the address whereof is stored in the first portion 90). In this way, the association between each register and the corresponding redundancy sector is not preset and is represented by the arrows. If the redundancy sector addressed by the first register fails, for example, it would be possible to replace the address of the failed redundancy sector with a further redundancy sector, as represented by the dashed arrow.

This applies, in particular, for enabling the redundancy of redundancy sectors activated during EWS.

The advantages of the described storage device are the following. First, it enables replacement of a failed unit not only during testing of the device inside the production plant (for example during EWS), but also when the device is in operation. In this way, the storage device presents a greater flexibility, and a consequent increase in yield.

Furthermore, it is possible to speed up also EWS testing, thanks to the use of the control unit 16 inside the storage device and an embedded algorithm, ruling out the need for any interfacing with external testing machines. This enables a reduction in the testing effort (development resources and testing times) aimed at identifying, at time zero, any failures that may occur subsequently during the life of the device (cycling, dedicated testing).

The storage device described herein involves a minimum increase in overall dimensions for the additional circuitry, thanks to the use principally of structures already present.

In particular, the implementation described herein of self-redundancy enables the use of the reading structure already present for operation of the memory array 2, the re-use of the RAM 7 for managing the failed sectors and of the sectors undergoing erasing, as well as the re-use of the address counter 5.

It is not necessary to use separate cells such as CAMs to store the address of the failed memory array sectors, but memory cells of the memory array may be used that are intended specifically for redundancy address storage.

The use of registers for loading redundancy information during turning-on of the storage device enables rapid detection of any replacement of a sector addressed to be read and addressing with the one operating correctly. In practice, the registers 22 operate as nonvolatile cells provided for traditional EWS redundancy, at the same time guaranteeing a more agile management of the existing structures.

The redundancy operations are altogether transparent to the user (for example, during modification, the state register is accessible to the user, either a product manager or a customer who requires information on the state of the operations).

The registers 22 may be moreover equipped with set/reset transistors for testing operations of a shadow type.

Finally, it is clear that numerous modifications and variations may be made to the storage device and to the redundancy method described and illustrated herein, all falling within the scope of the invention, as defined in the annexed claims. For example, although the foregoing description refers only to sector redundancy, as indicated, the invention is applicable also to redundancy of a different type, for example column redundancy, byte redundancy, or row redundancy. Furthermore, the redundancy may be activated also following upon an unsuccessful programming operation.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A nonvolatile storage device, comprising:
   a memory array divided into a plurality of data-storage units;
   a control unit including detection means for detecting the functionality of the data-storage units;
   a redundancy-detection unit, enabled by the control unit, said redundancy-detection unit including volatile-memory elements connected through a sequential connection of a daisy-chain type; and
   a plurality of redundancy-storage units for replacing respective data-storage units;
   a nonvolatile memory unit for nonvolatile-storing of redundancy information; and
   a data bus connected to the redundancy-detection unit and said nonvolatile memory unit for transferring addresses of failed data-storage units from the redundancy-detection unit to the nonvolatile memory unit and storing the addresses of failed data-storage units therein.

2. The device according to claim 1, further comprising decoding, addressing and reading circuits, connected to the memory array, the nonvolatile memory unit being connected to the decoding, addressing and reading circuits.

3. The device according to claim 2, further comprising an address bus connected to the decoding, addressing and reading circuits and to the redundancy-detection unit, the redundancy-detection unit comprising routing means enabled by the control unit for connecting the address bus to the data bus upon detection of a failed data-storage unit.

4. A nonvolatile storage device, comprising:
   a memory array divided into a plurality of data-storage units;
   a control unit including detection means for detecting the functionality of the data-storage units;
   a redundancy-detection unit, enabled by the control unit, said redundancy-detection unit including volatile-memory elements connected through a sequential connection of a daisy-chain type;
   a plurality of redundancy-storage units for replacing respective data-storage units; and
   an address bus, wherein said redundancy-detection unit comprises:
      input means, connected to the address bus;
      a redundancy bus, connected to the input means;
      a plurality of registers, made up of a first portion for storing, in each register, an address of a failed data-storage unit, and a second portion for storing a guard information, the first portion having a data input connected to the redundancy bus and an enable input; and
      an enabling circuit, connected to the enable inputs of said registers and to the control unit for sequentially enabling the registers to load addresses from the redundancy bus.

5. The device according to claim 4 wherein each of the registers comprises a guard output connected to a respective second portion, and wherein the enabling circuit comprises a plurality of enabling elements, one for each register, each enabling element having a first input connected to the guard output of a respective register, a second input receiving a load signal from the control unit, and a third input connected to a guard output of a preceding register in the sequential connection.

6. The device according to claim 4 wherein the redundancy-detection unit further comprises a plurality of comparison gates, one for each register, each comparison gate having a first input connected to the redundancy bus, a second input connected to a data output of a respective register, and an output supplying a recognition signal for disabling a failed data-storage unit, and having enabling means for enabling a respective redundancy-storage unit.

7. The device according to claim 6 wherein each comparison gate is rigidly connected to a respective redundancy-storage unit.

8. The device according to claim 4 wherein each register comprises a third portion for storing the address of a redundancy-storage unit.

9. A redundancy method in a nonvolatile storage device containing a memory array made up of a plurality of data-storage units, comprising:
   supplying a data-modification command to at least one of the data-storage units;
   verifying the correctness of the data in the data-storage unit(s);
   in the event of an error being detected in the data-storage unit(s), temporarily storing the address of the data-storage unit(s) in a redundancy-detection unit and storing the address in a nonvolatile way in a nonvolatile memory unit;
   generating a read address of a data-storage unit;
   comparing the read address to the address stored in the redundancy-detection unit; and
   in the event of equality, disabling the read address and enabling a redundancy-storage unit.

10. The method according to claim 9 wherein;

before the step of temporarily storing and the step of storing in a nonvolatile way, the step of supplying a data-modification command and the step of verifying are repeated, in the event of a negative result of the step of verifying, for at the most a first number of times; and after the steps of temporarily storing and storing in a nonvolatile way, the step of supplying a data-modification command and the step of verifying are repeated, in the event of a negative result of the step of verifying, for at the most a second number of times and in the event of a negative result after the second number of times, an error signal is generated.

11. A nonvolatile storage device, comprising:

a sequence of volatile redundancy cells;

a plurality of nonvolatile redundancy cells separate from the volatile redundancy cells;

a redundancy bus coupling the nonvolatile redundancy cells to the volatile redundancy cells; and a controller comprising a plurality of AND gates coupling an output of a volatile redundancy cell with an enabling input of a sequentially following volatile redundancy cell and configured to enable one of the plurality of volatile redundancy cells to store data from a nonvolatile redundancy cell when a previous volatile redundancy cell in the sequence of volatile redundancy cells stores data from a nonvolatile redundancy cell.

12. The nonvolatile storage device of claim 11 wherein the controller comprises a microprocessor.

13. A nonvolatile storage device, comprising:

a sequence of volatile redundancy cells coupled together in a daisy-chain fashion;

a plurality of nonvolatile redundancy cells separate from the volatile redundancy cells;

a redundancy bus coupling the nonvolatile redundancy cells to the volatile redundancy cells; and a controller, wherein the controller is configured to enable one of the plurality of volatile redundancy cells to store data from a nonvolatile redundancy cell when a previous volatile redundancy cell in the sequence of volatile redundancy cells stores data from a nonvolatile redundancy cell.

14. A method for loading previously stored data into registers at memory power-on, comprising:

storing redundancy data in a nonvolatile memory array;

transferring the previously stored data from the nonvolatile memory array to a redundancy-detection unit;

writing the data in volatile memory registers coupled together in a daisy-chain fashion in the redundancy-detection unit;

storing an address of a redundancy sector in a register; and when the redundancy sector addressed by the register fails, storing an address of a further redundancy sector in the register.

15. A method for loading previously stored data into registers at memory power-on, comprising:

storing redundancy data in a nonvolatile memory array;

transferring the previously stored data from the nonvolatile memory array to a redundancy-detection unit;

writing the data in volatile memory registers in the redundancy-detection unit; and storing a plurality of addresses of a plurality of redundancy sectors in a plurality of registers connected through a sequential connection of a daisy-chain type.

16. The nonvolatile storage device of claim 13, further comprising:

a plurality of AND gates configured to couple the sequence of volatile redundancy cells coupled together in the daisy-chain fashion.

17. The method of claim 15, further comprising:

when a redundancy sector in the plurality of redundancy sectors addressed by a register in the plurality of registers fails, storing an address of a further redundancy sector in the register.

* * * * *